United States Patent [19]

Shirai

[11] Patent Number: 5,349,289
[45] Date of Patent: Sep. 20, 1994

[54] CLAMP-ON MULTIMETER HAVING A DISPLAY FOR INDICATING THE RESULTS OF A PLURALITY OF MEASUREMENTS

[75] Inventor: Etsuo Shirai, Ueda, Japan

[73] Assignee: Kaise Kabushiki Kaisha, Nagano, Japan

[21] Appl. No.: 942,545

[22] Filed: Sep. 9, 1992

[30] Foreign Application Priority Data

Apr. 27, 1992 [JP] Japan .................................. 4-134143

[51] Int. Cl.⁵ .......................................... G01R 33/00
[52] U.S. Cl. ..................................... 324/127; 324/116;
324/117 R; 324/126
[58] Field of Search ............... 324/127, 115, 114, 116,
324/129, 149, 378, 429, 426, 143; 364/483, 481;
340/660

[56] References Cited

U.S. PATENT DOCUMENTS

| | | |
|---|---|---|
| 791,785 | 6/1905 | Hertzberg et al. .................. 324/143 |
| 4,485,343 | 11/1984 | Milkovic ............................... 324/142 |
| 4,799,005 | 1/1989 | Fernandes ............................ 324/142 |
| 4,829,239 | 5/1989 | Holstein et al. .................... 324/117 H |
| 4,931,725 | 6/1990 | Hutt et al. ........................... 324/142 |

FOREIGN PATENT DOCUMENTS 61-30771 2/1986 Japan .

*Primary Examiner*—Vinh Nguyen
*Attorney, Agent, or Firm*—Jordan and Hamburg

[57] ABSTRACT

A clamp-on multimeter includes a body section, and a clamp section having a pair of clamp cores for clamping a conductor to be measured. The front ends of the clamp cores are capable of closing and opening. An input section receives signals introduced from a conductor. A display section simultaneously displays a first parameter corresponding to an induction voltage induced in the clamp section, and a second parameter corresponding to the measured signals input via the input section. A control section controls the simultaneously display of the first parameter and the second parameter on the display section.

13 Claims, 5 Drawing Sheets

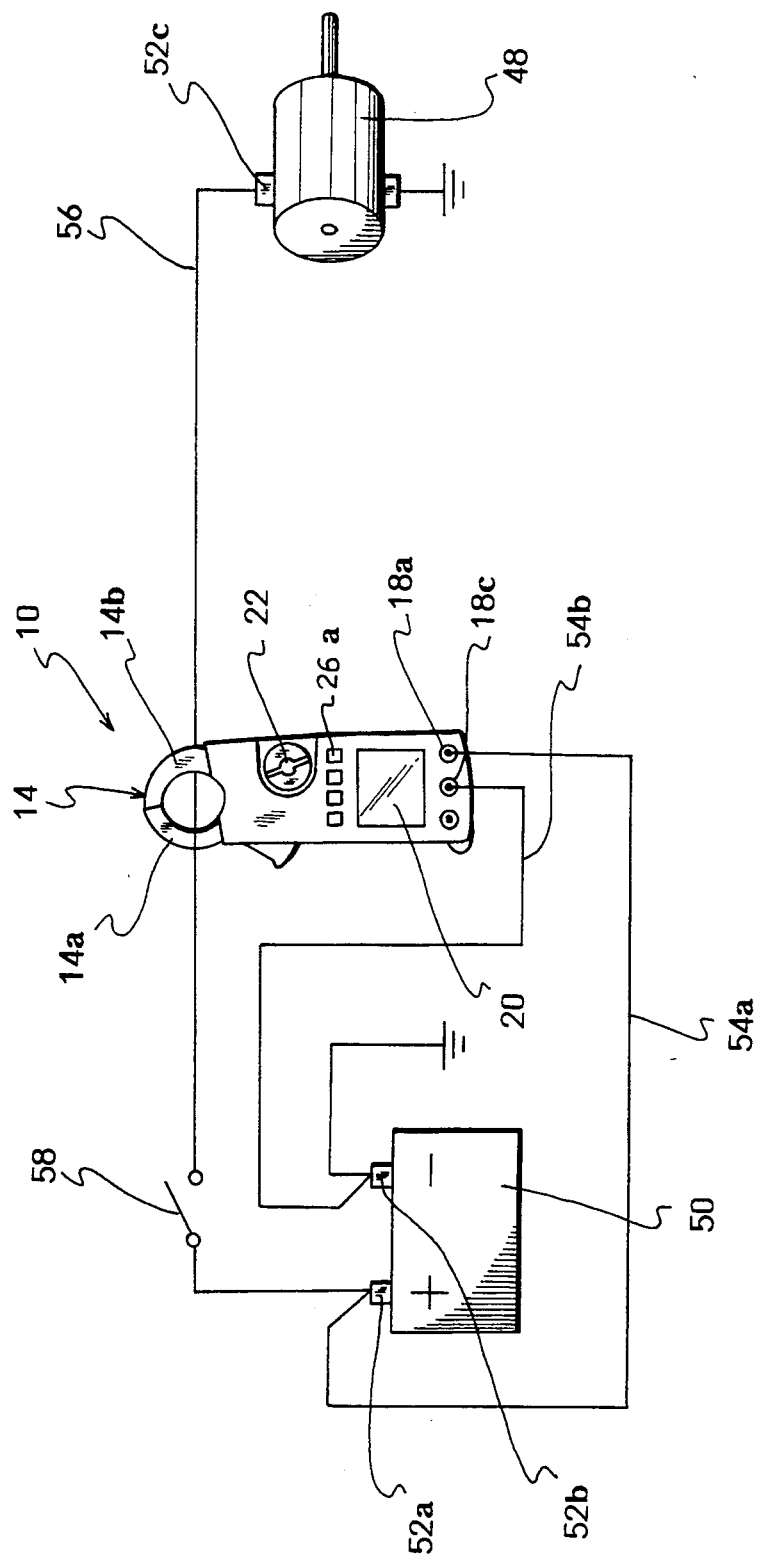

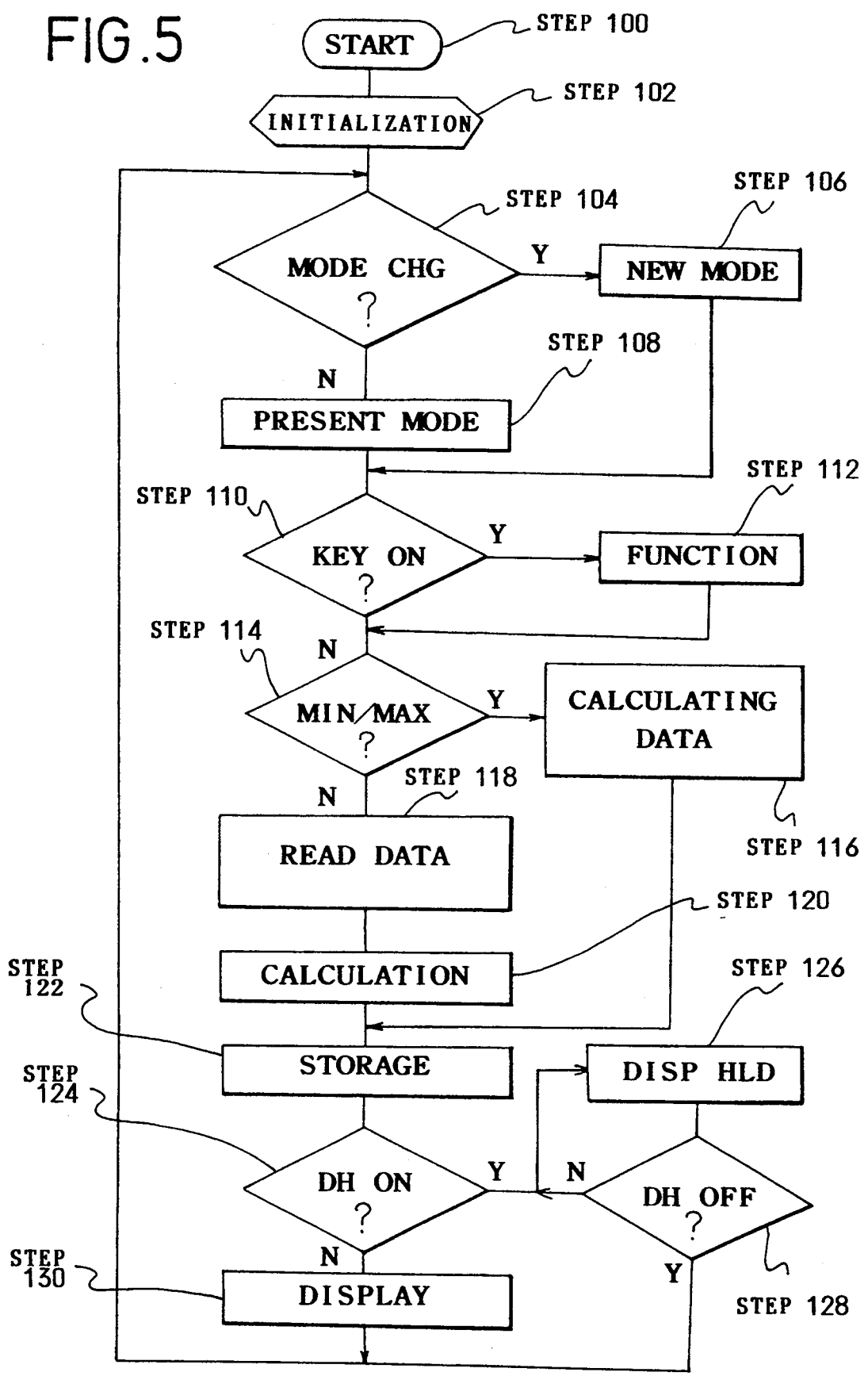

CLAMP-ON MULTIMETER HAVING A DISPLAY FOR INDICATING THE RESULTS OF A PLURALITY OF MEASUREMENTS

BACKGROUND OF THE INVENTION

The present invention relates to a clamp-on multimeter, more precisely relates to a clamp-on multimeter, which has a body section; a clamp section having a pair of clamp cores for clamping a conductor to be measured, each front end of the clamp cores being capable of closing and opening; an input section to which measured signals introduced from a conductor to be measured are inputted; and a display section being capable of showing an element (i.e. a parameter), which is measured on the basis of induction voltage induced in the clamp section or of the measured signals inputted via the input section.

There is disclosed an example of clamp-on multimeters, which have the body section, the clamp section, the input section and the display section, in the Japanese Provisional Publication (Kokai) Gazette No. 61-30771. The clamp-on multi-meter disclosed in the gazette is capable of measuring both of electric current and voltage. Electric current, which passes in a conductor, is measured by the clamp section, which clamps the conductor. The electric current is known by calculating induction voltage in the clamping section induced by the current. While, voltage is measured on the basis of measured signals, which are introduced from the conductor to the input section by lead wires, which connect the conductor to the input section. The voltage is known by calculating the measured signals. The calculated data indicating the electric current or voltage are converted to digital signals and shown on the display section as digital value.

The conventional clamp-on multimeter, however, has a disadvantage. Namely, the clamp-on multimeter is able to show only one of measured elements, e.g. electric current, voltage, so a plurality of the elements cannot be simultaneously shown on the display section. In case of simultaneously measuring or watching the current and voltage, for example, two clamp-on multimeters must be prepared to measure the current by the one and to measure the voltage by the other. Preparing two clamp-on multimeters is uneconomical and troublesome.

SUMMARY OF THE INVENTION

An object of the present invention is to provide a clamp-on multimeter, which is capable of simultaneously showing a plurality of measured elements.

To achieve the object, the clamp-on multimeter of the present invention basically comprises:

a body section accommodating electric circuits;

a clamp section having a pair of clamp cores, which are provided to the body section, for clamping a conductor to be measured, the clamp cores being made of a magnetizable material, each of the clamp cores being formed into an arc shape, each frond end of the clamp cores being capable of closing and opening;

an input section, to which measured signals introduced from a conductor to be measured are inputted, being provided in the body section;

a display section being provided in the body section, the display section being capable of simultaneously showing a first element, which is measured on the basis of induction voltage induced in the clamp section, and a second element, which is measured on the basis of the measured signals inputted via the input section; and a control section measuring the first element and the second element on the basis of the induction voltage and the measured signals, and simultaneously showing the first element and the second element on the display section.

To put it concretely, the first element is DC-current, AC-current, frequency, etc., and the second element is DC-voltage, AC-voltage, frequency, resistance, temperature, etc.. A selecting section for selecting the first element and the second element may be provided to the body section. Moreover, the control section may be capable of measuring maximum value and/or minimum value of the first element and/or the second element, and showing the maximum value and/or the minimum value on the display section.

With above described structure, the control section is able to measure the first element and the second element on the basis of the induction voltage and the measured signals. And the control section is able to show the first element and the second element on the display section simultaneously. Therefore, a plurality of elements can be measured and shown by one clamp-on multimeter.

BRIEF DESCRIPTION OF THE DRAWINGS

An embodiment of the present invention will now be described by way of examples and with reference to the accompanying drawings, in which:

FIG. 4 is an explanation view showing a state wherein electric current of a starter and voltage of a battery are simultaneously measured by the clamp-on multimeter; and FIG. 5 is a flowchart showing the action of the clamp-on multimeter.

DETAILED DESCRIPTION OF THE PREFERRED EMBODIMENT

A preferred embodiment of the present invention will now be described in detail with reference to the accompanying drawings.

Figure 1:
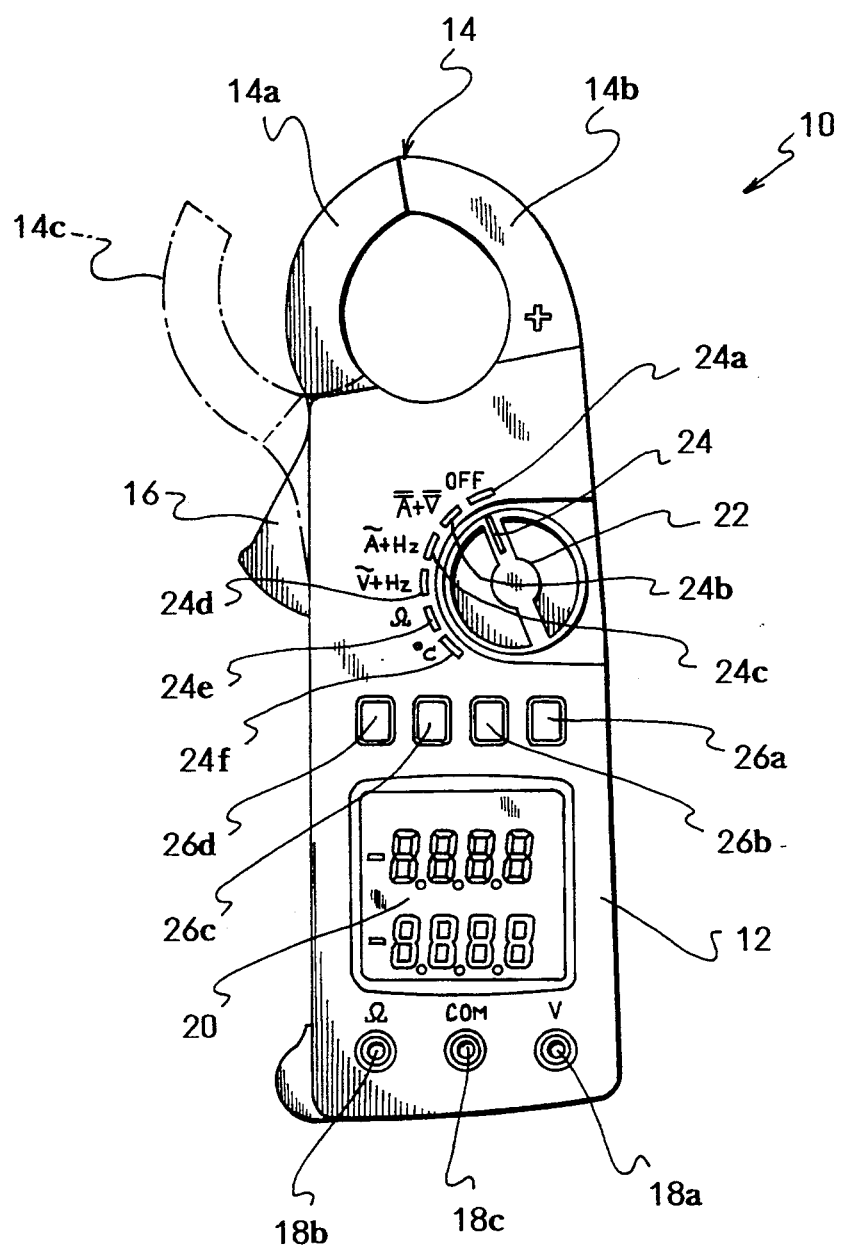
FIG. 1 is a front view of a clamp-on multimeter of the embodiment.
Figure 2:
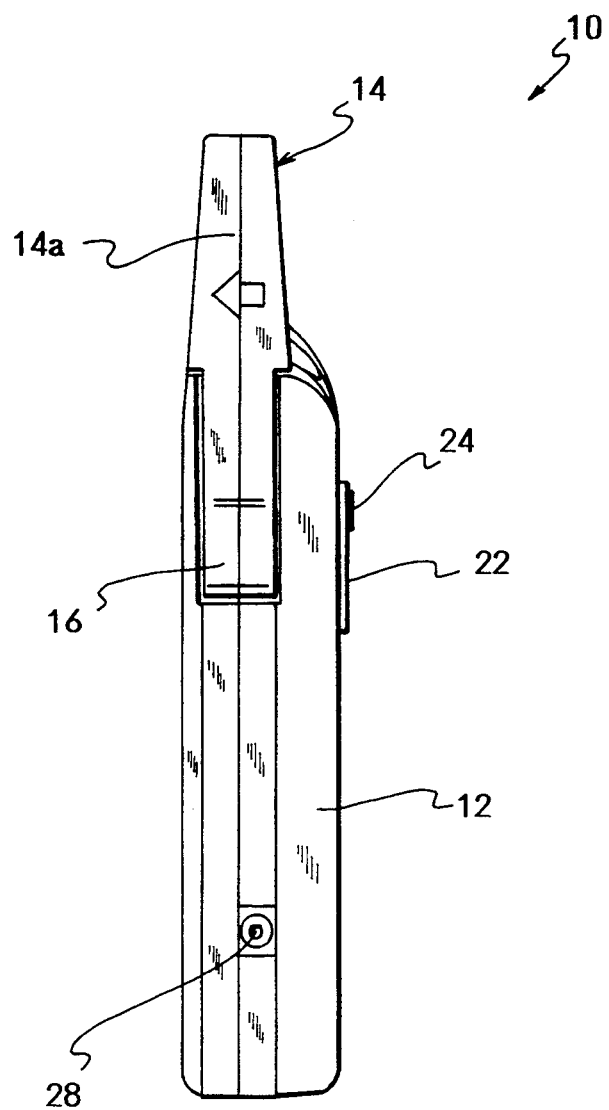
FIG. 2 is a side view of the clamp-on multimeter.

In FIGS. 1 and 2, a body section 12 has a slender shape whereby a user is able to have the body section 12 by a hand. Electric circuits including a power source are accommodated in the body section 12.

A clamp section 14 is provided to the top part of the body section 12. A clamp section 14 has a pair of clamp cores 14a and 14b. The clamp cores 14a and 14a are made of a magnetizable material, and formed into arc shapes. The clamp core 14a is movably attached to the body section 12 and capable of moving to a position 14c shown by one-dot-chain lines; the other clamp core 14b is fixed at the body section 12. By this structure, front ends of the clamp cores 14a and 14b are capable of mutually opening and closing to clamp conductors, e.g. wires, cables, by handling a lever 16. The state of the clamp cores 14a and 14b shown in FIG. 1 by solid lines is a clamping state wherein the front ends thereof are closed to clamp conductors.

Input sections 18a, 18b and 18c are provided in the body section 12. The input sections 18a, 18b and 18c include socket terminals. The input section 18a is for measuring electric voltage; the input section 18b is for measuring resistance or temperature; and the input section 18c is a common terminal for measuring voltage, resistance and temperature. Ends of lead wires (not shown) are respectively connected to the input sections 18a and 18c, or 18b and 18c so as to introduce measured signals, which indicate voltage, resistance or temperature of a conductor, thereto.

A display section 20 is, for example, a liquid crystal display (LCD). There are an upper part and a lower part on the LCD 20. First measured elements, e.g. DC-current, AC-current, frequency, will be shown in the upper part; second measured elements, e.g. DC-voltage, AC-voltage, frequency, resistance, temperature, will be shown in the lower part. The first elements are measured on the basis of induction voltage induced in the clamp cores 14a and 14b. The induction voltage is induced when the clamp section 14 clamps a conductor through which electric current passes. While, the second elements are measured on the basis of measured signals introduced to the input sections 18a, 18b and 18c. The first element and the second element are shown in the upper and the lower parts of the LCD 20 simultaneously.

A rotary switch 22 is provided on the body section 12 so as to turn on and off the power source. By turning the rotary switch 22, measuring modes can be changed. If a pointer 24 indicates a point 24a, as shown in FIG. 1, the state is a power-off state; if the pointer 24 indicates a point 24b, 24c, 24d, 24e or 24f, the state is a power-on state. Details of the measuring modes are as follows:

(1) First Mode
The pointer 24 indicates the point 24b.
The first element is DC-current.
The second element is DC-voltage.
(2) Second Mode
The pointer 24 indicates the point 24c.
The first element is AC-current.
The second element is frequency of the AC-current.
(3) Third Mode
The pointer 24 indicates the point 24d.
The first element is none.
The second elements are AC-voltage and the frequency thereof.
(4) Fourth Mode
The pointer 24 indicates the point 24e.
The first element is none.
The second element is resistance.
(5) Fifth Mode
The pointer 24 indicates the point 24f.
The first element is none.
The second element is temperature.

Function keys 26a, 26b, 26c and 26d are push-keys. Functions of the keys 26a, 26b, 26c and 26d are as follows:

① The key 26a is a display hold (DH) key for holding shown value on the LCD 20. If the DH key 26a is pushed again, the holding is released. Note that, in case that the measuring mode is the Fourth or Fifth Mode, one value shown will be held.

② The key 26b is a record (REC) key for changing shown value on the LCD 20. If the REC key 26b is pushed a plurality of times, value shown in the upper and lower parts of the LCD 20 will be changed in order as follows:
(a) maximum current - maximum voltage
(b) maximum current - minimum voltage
(c) minimum current - maximum voltage
(d) minimum current - minimum voltage ③ The key 26c is a difference (DIFF) key for calculating difference between measured value value and standard value. If the DIFF key 26c is pushed before measuring, the LCD 20 shows zero; if the DIFF key 26c is pushed during measuring, the LCD 20 shows the difference wherein the present measured value becomes the standard value, and, after this, measured value will be compared therewith.

④ The key 26d is a duty (DUTY) key for calculating duty ratio. If the DUTY key 26d is pushed during measuring AC-current and AC-voltage, the LCD 20 changes value from frequency to duty ratio. When the DUTY key 26d is pushed again, the LCD 20 changes value from duty ratio to frequency.

An external source terminal 28, which is a socket terminal, is provided in the body section 12. When an external power source is used as a power source, a plug of an AC adapter (not shown), which converts AC to DC, is connected to the terminal 28.

Successively, electric circuits of the clamp-on multimeter 10 will be explained with reference to FIG. 3.

Dry batteries 30 are accommodated in the body section 12 as a power source. Voltage of the batteries 30 is inputted to a power source circuit 32. The voltage inputted is transformed into prescribed level, and supplied to other circuits. In case of exhausted batteries or long time operation of the meter 10, the AC adapter will be connected to the terminal 28. DC voltage converted by the AC adapter is transformed into the prescribed level, and supplied to other circuits.

When the clamp section 14 clamps a conductor in which electric current passes, an amplifier 34 amplifies analogue induction voltage, which is induced in the clamp section 14, to prescribed level, which an A/D converter 36a is capable of treating. The A/D converter 36a converts the analogue voltage, which is amplified by the amplifier 34, to digital signals.

An attenuator 38 attenuates analogue measured signals, which are introduced to the input sections 18a and 18c, to prescribed level, which an A/D converter 36b is capable of treating. The A/D converter 36b converts the analogue signals, which is attenuated by the attenuator 38, to digital signals.

A fixed current circuit 40 supplies fixed current to a conductor, e.g. a resistance element, a thermistor, etc., when resistance or temperature of the conductor, which is connected to the input sections 18b and 18c, is measured. By supplying the fixed current, analogue voltage, which generates in the conductor, is inputted to the A/D converter 36b as measured signals in order to convert them to digital signals.

A wave-form shaping circuit 42 shapes wave-form of the output signals of the amplifier 34 and the attenuator 38 when frequency is measured.

A central processing unit (CPU) 44 has a control unit, a arithmetic logical unit and memory units, e.g. RAM, ROM, as a control section. The CPU 44 calculates the value of the first and the second elements. The value of the first elements is calculated on the basis of induction voltage, which is induced in the clamp section 14 and converted to digital signals by the A/D converter 36a; the value of the second elements is calculated on the basis of measured signals, which are introduced to the input sections 18a, 18b and 18c and converted to digital signals by the A/D converter 36b. The CPU 44 stores the value of the first and the second elements in the memory unit, and shows them on the LCD 20. Furthermore, the CPU 44 is capable of calculating maximum and minimum value of the first and the second elements.

A driver circuit 46 drives the LCD 20 on the basis of data sent from the CPU 44.

Next, the action of the clamp-on multimeter 10 will be explained with reference to FIGS. 3 and 4. Note that, the case of measuring DC-current, which is supplied to a starter 48 of a vehicle, and DC-voltage of a battery 50 thereof, as shown in FIG. 4, will be described as an example.

Figure 3:
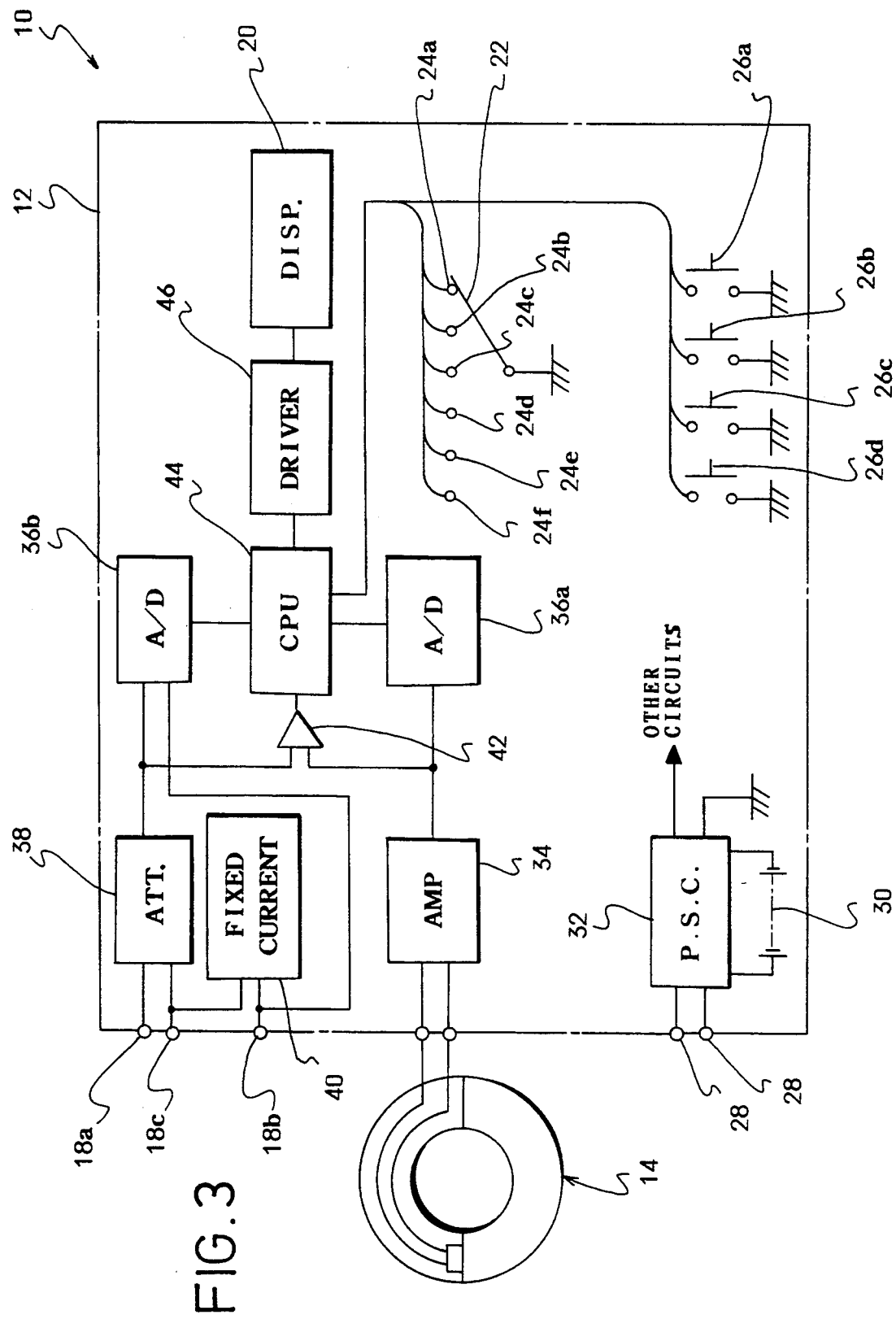
FIG. 3 is a block diagram of the clamp-on multimeter.

In FIG. 3, the input section 18a and one terminal 52a of the battery 50 are connected by a lead wire 54a; the input section 18c and the other terminal 52b of the battery 50 are connected by a lead wire 54b. The clamp core 14a is moved to open the clamp section 14 by handling the lever 16. An electric wire 56, which is an example of conductors to be measured and which connects a terminal 52c to the terminal 52a, is introduced into the clamp section 14 via the clearance between the front ends of the clamp cores 14a and 14b, which have been opened. After the wire 56 is introduced into the clamp section 14, the clamp core 14a is moved to close the clamp section 14 by handling the lever 16 so as to clamp the wire 56.

After clamping the wire 56 by the clamping section 14, the rotary switch 22 is turned until the pointer 24 indicates the point 24b so as to turn the power source on and to assign the measuring mode to the CPU 44.

Successively, the action of the meter 10 will be described with reference to FIG. 5.

When the rotary switch 22 is turned, DC-voltage having the prescribed level is supplied from the power source circuit 32 to other circuits (STEP 100). Upon turning the power source on, a control program is loaded to the CPU 44, the CPU 44 and the A/D converters 36a and 36b are initialized, and the LCD 20 is cleared to show zero (STEP 102).

Since the pointer 24 of the rotary switch 22 indicates the point 24b, the CPU 44 has been understanding that the present measuring mode is the First Mode: the first element is DC-current and the second element is DC-voltage. In this state, the CPU 44 checks if the measuring mode is changed or not (STEP 104). If the measuring mode is not changed, the CPU 44 executes measuring under the First Mode. Namely, the CPU 44 starts to measure the DC-current supplied to the starter 48 and the PC-voltage of the battery 50 (STEP 108). On the other hand, if the measuring mode is changed at the STEP 104, the CPU 44 starts to measure under the new mode (STEP 106).

In this example, the measuring mode is the First Mode. Upon turning a switch 58 on, DC-current passes the wire 56 clamped, and the starter 48 is driven. Since the DC-current passes the wire 56, a magnetic field is formed around the wire 56, so that induction voltage is induced in the clamp section 14, which exists in the magnetic field. The induction voltage will be read by the CPU 44, and the CPU 44 is capable of calculating the value of the induction voltage to get the value of PC-current passing the wire 56. Measured signals corresponding to the DC-voltage of the battery 50, which are introduced to the input sections 18a and 18c via the lead wires 54a and 54b, are also read by the CPU 44, and the CPU 44 is also capable of calculating the value of the measured signals to get the value of DC-voltage of the wire 56.

After the STEP 106 or 108, the CPU 44 checks if the function keys 26a, 26b, 26c and 26d are pushed or not (STEP 110). If any function key 26a, 26b, 26c or 26d is pushed, the CPU 44 understands assigned function (STEP 112).

After the STEP 110 or 112, the CPU 44 checks if the REC key 26b is pushed or not (STEP 114). Namely, the CPU 44 checks if maximum and/or minimum value of the DC-current and the DC-voltage should be calculated or not. If the REC key 26b is pushed, the CPU 44 calculates the maximum and/or minimum value under the state assigned by the REC key 26b (see ②-(a), (b), (c) and (d)) (STEP 116), and stores the value in the memory unit (STEP 122). On the other hand, if the RISC key 26b is not pushed at the STEP 114, the CPU 44 reads the data of the induction voltage in the clamp section 14 and the voltage of the battery 50 inputted to the input sections 18a and 18c (STEP 118), and calculated the data to get the value of the DC-current and the DC-voltage (STEP 120). The two object value of the DC-current and the DC-voltage are stored in the memory unit of the CPU 44 (STEP 122).

Next, the CPU 44 checks if the DH key 26a is pushed or not (STEP 124). If the DH key 26a is pushed, the CPU 44 simultaneously shows the two value, which have stored in the memory unit, on the upper and lower parts of the LCD 20 and fixes them thereon until release (STEP 126). During the fixation, the CPU 44 checks if the fixation is released or not (STEP 128). If the fixation is released, the CPU 44 returns to the STEP 104 for the next cycle of measuring. On the other hand, if the DH key 26a is not pushed at the STEP 124, the CPU 44 simultaneously shows the two value, which have stored, on the upper and lower parts of the LCD 20 (STEP 130), and the CPU 44 returns to the STEP 104 for the next cycle of measuring without fixing the shown value.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A clamp-on multimeter, comprising:
   a body section accommodating electric circuits;
   a clamp section having a pair of arcuate clamp cores on said body section, for clamping a conductor to be measured, said clamp cores being made of a magnetizable material, said clamp cores having front ends capable of being closed and opened with respect to one another;
   an input section for receiving signals to be measured from a conductor, said input section being in said body section;
   a display section in said body section, said display section comprising means for simultaneously displaying a first parameter corresponding to an induction voltage induced in said clamp section, and a second parameter corresponding to measured signals input via said input section; and
   a control section measuring said induction voltage in said clamp section and the measured signals input via said input section and, in response thereto, simultaneously providing the first parameter and the second parameter to said display section.

2. The clamp-on multimeter according to claim 1, wherein the first parameter is DC-current, AC-current or frequency, and the second parameter is DC-voltage, AC-voltage, frequency, resistance or temperature.

3. The clamp-on multimeter according to claim 2, further comprising a selecting section for selecting the first parameter and the second parameter.

4. The clamp-on multimeter according to claim 1, wherein said control section comprises means for measuring maximum value or minimum value of the first parameter and the second parameter, and providing the maximum value or the minimum value to said display section.

5. The clamp-on multimeter according to claim 4, wherein the first parameter is DC-current, AC-current or frequency, and the second parameter is DC-voltage, AC-voltage, frequency, resistance or temperature.

6. The clamp-on multimeter according to claim 5, further comprising a selecting section for selecting the first parameter and the second parameter.

7. The clamp-on multimeter according to claim 1, wherein said control section comprises means for measuring maximum value and minimum value of the first parameter and the second parameter, and providing the maximum value and the minimum value to said display section.

8. The clamp-on multimeter according to claim 7, wherein the first parameter is DC-current, AC-current or frequency, and the second parameter is DC-voltage, AC-voltage, frequency, resistance or temperature.

9. The clamp-on multimeter according to claim 8, further comprising a selecting section for selecting the first parameter and the second parameter.

10. The clamp-on multimeter according to claim 9, wherein the first parameter is DC-current and the second parameter is DC-voltage.

11. The clamp-on multimeter according to claim 10, further comprising a selecting section for selecting the first parameter and the second parameter.

12. The clamp-on multimeter according to claim 11, wherein the first parameter is AC-current and the second parameter is AC-voltage.

13. The clamp-on multimeter according to claim 12, further comprising a selecting section for selecting the first parameter and the second parameter.

* * * * *